United States Patent [19]

Yeh et al.

[11] 4,163,988

[45] Aug. 7, 1979

[54] SPLIT GATE V GROOVE FET

[75] Inventors: Keming W. Yeh, Westchester; James L. Reuter, Rancho Palos Verdes, both of Calif.

[73] Assignee: Xerox Corporation, Stamford, Conn.

[21] Appl. No.: 873,333

[22] Filed: Jan. 30, 1978

[51] Int. Cl.² ............................................ H01L 29/06
[52] U.S. Cl. ........................................ 357/55; 357/22; 357/23; 357/41
[58] Field of Search ..................... 357/22, 23, 41, 55

[56] References Cited

U.S. PATENT DOCUMENTS

| | | | |
|---|---|---|---|
| 4,003,036 | 1/1977 | Jenne | 357/55 |
| 4,065,783 | 12/1977 | Ouyang | 357/23 |
| 4,070,690 | 1/1978 | Wickstrom | 357/23 |

*Primary Examiner*—Edward J. Wojciechowicz
*Attorney, Agent, or Firm*—Ronald L. Taylor

[57] ABSTRACT

A split gate V groove FET device mounted in a substrate with a first terminal comprising a body of a first conductive material in the apex of said V groove, said first terminal connected to a first conductive channel in a first side of said V groove to form a first transistor and said first terminal connected to a second conductive channel in a second side of said V groove to form a second transistor.

21 Claims, 5 Drawing Figures

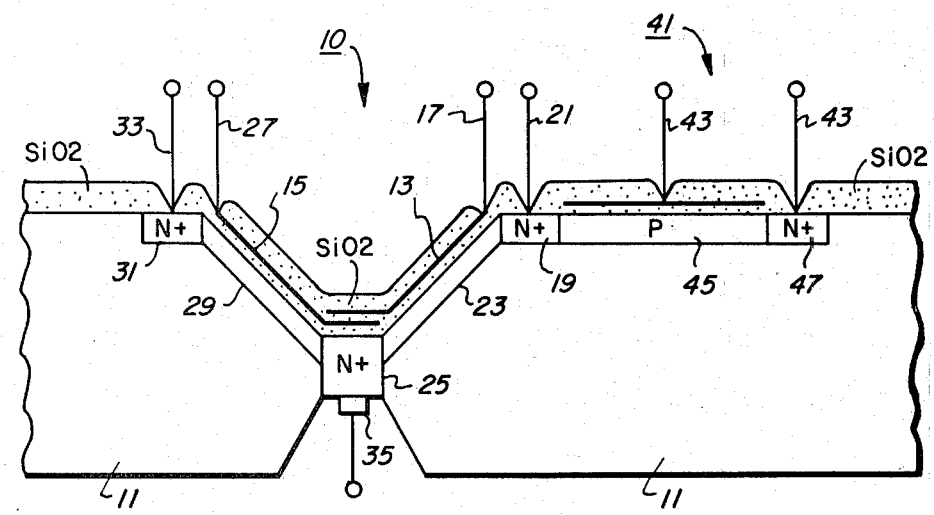
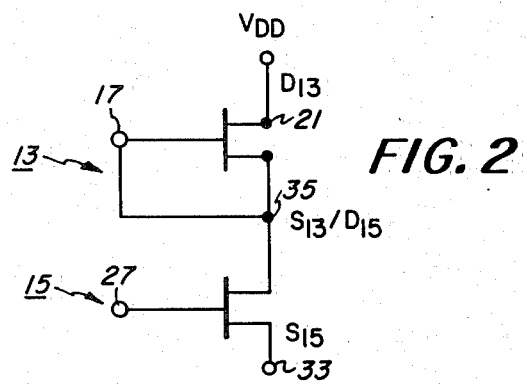
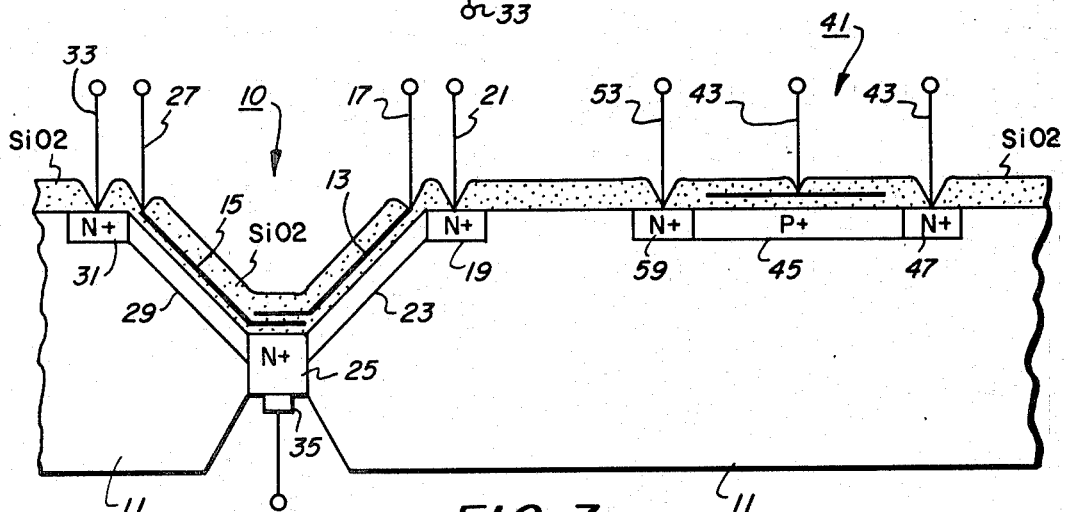

SPLIT GATE V GROOVE FET

BACKGROUND OF THE INVENTION

FIELD OF THE INVENTION

The invention relates to the field of semiconductors, specifically, VMOS semiconductors.

VMOS semiconductors are known in the prior art. Examples are shown in U.S. Pat. Nos. 3,975,221 and 3,924,265.

Prior art patents also include 3,761,785 showing separate gate electrodes in a MESA structure field effect transistor and U.S. Pat. No. 3,893,155 showing the formation of complimentary MIS field effect transistors using the sides of the V groove.

Other examples of grooved MOS field effect transistors are shown in U.S. Pat. Nos. 3,412,297; 3,518,509; 3,775,693; 3,975,752; 3,995,172 and 4,003,126.

One of the disadvantages of a VMOS is that all must share a common terminal, either as source or a drain within the substrate. This is clearly shown in U.S. Pat. No. 3,975,221, FIG. 6 where two V groove MOS devices are shown formed with common source. As shown in the prior art patent, all the VMOS devices must share a common terminal within substrate 14.

SUMMARY OF THE INVENTION

The present invention employs a structure which does not require a common terminal be shared among all VMOS's located on a single substrate. In this device, each VMOS is electrically independent of all other VMOS's mounted on a single substrate.

This isolation of each VMOS from every other VMOS is obtained by using the multi-wall feature of the VMOS to build two separate transistors into a single VMOS structure. In this manner, a single stage requiring two separate transistor structures such as an inverter stage, can be built into a single VMOS cavity.

The advantages of this structure is a more dense packing of the transistor components in an integrated circuit device.

The higher density carries with it the advantages of a smaller overall dimension, fewer parasitics, better performance, a cheaper cost per unit function and less power consumption.

In this device separate MOSFETS are built in the side walls of the V groove, etches into a silicon substrate while maintaining independent accessibility of source and drain within the V groove. Thus, in one groove a plurality of devices may be fabricated.

Accordingly, it is the object of the invention to build a split gate VMOS with terminals isolated from ground or the supporting substrate and thereby to form within one symmetrical V groove at least two separate transistors.

BRIEF DESCRIPTION OF THE DRAWINGS

FIG. 1 is a cross sectional view of a split gate VMOS according to this invention.

FIG. 2 is a schematic of the connection of two separate independent transistors as an inverter stage within a single V groove.

FIG. 3 is a cross section view of a split gate VMOS according to this invention and electrically isolated from a second transistor on the same substrate.

FIG. 4b is a schematic showing an interconnection for the end FETS of FIG. 4a.

DESCRIPTION OF THE PREFERRED EMBODIMENT

Figure 4A:
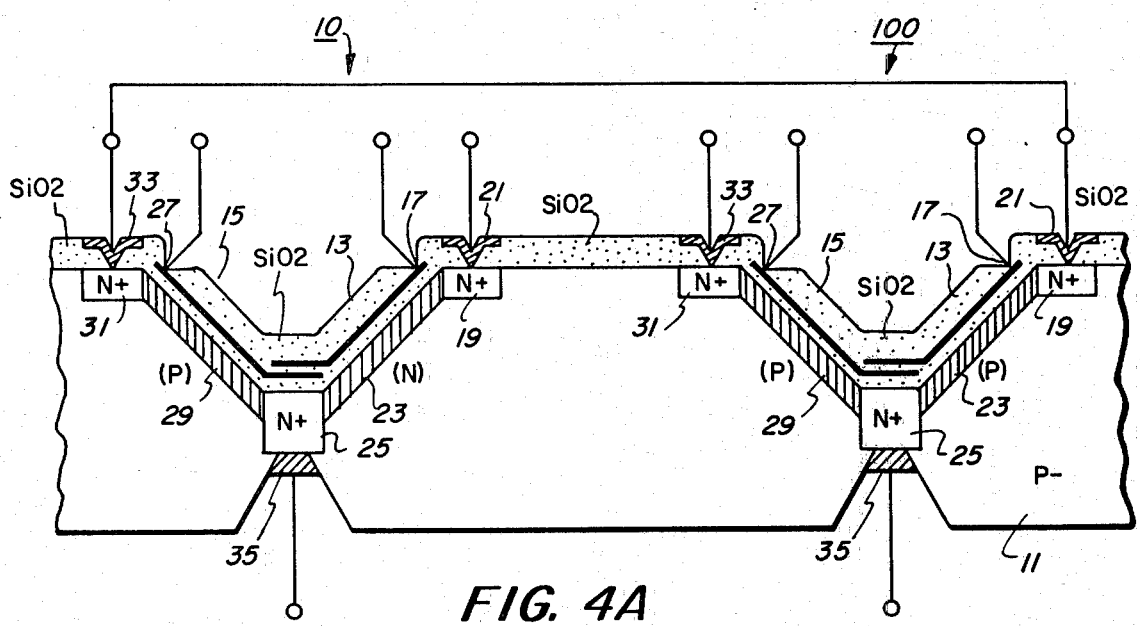
FIG. 4a is a cross section view of a plurality of split gate VMOS's according to this invention located on a common substrate and electrically isolated from each other.

A split gate VMOS is shown generally as 10 in FIG. 1. According to the invention, its component parts form two separate transistors, 13 and 15, shown as having gates 17 and 27, respectively. Additionally, forming part of transistor 13 is drain 19 having terminal 21, channel region 23 and source 25.

The gate 17 is formed of conducting polysilicon or aluminum. Transistor 13 may be a depletion MOSFET employing N conductive material in the channel region, and doped N conductive material at the source 25. Also shown within the single VMOS 10 structure is a second transistor 15, having gate 27, a channel region 29, shown as P conductive material, a source 31, shown as doped N conductive material, a conductive terminal 33, connected to said source 31 and doped N conductive material as drain 25 which is shown in common with transistor 13.

A layer of non-conductive SiO2 is provided over the channel regions and within the V groove, separating the conductive gate elements 17 and 27 from the respective channel members 23 and 29. As shown, the conductive gate members 17 and 27 are co-extensive and spaced adjacent to the channel regions 23 and 29.

Also in accordance with this invention, a conductive terminal 35 is attached to conductive material 25.

The manner of using the two separate transistors located in a single V groove is shown in FIG. 2. The gate 17 of transistor 13 is connected to terminal 35. The two MOSFETS 13 and 15 are arranged as an inverter stage employing the two MOSFETS may be built within a single V groove.

The advantage of this invention may then be seen in the schematic of FIG. 2 wherein the two separate MOSFETS are mounted in a one V groove.

Additionally, the transistors 13 and 15 may be connected to other transistors located on the same substrate 11, remaining isolated from each other.

Of course, as this is recognized within the art, it would be possible to interchange the type of conductivity material replacing N doped conductive material as shown with P doped conductive material, or replacing N conductivity material with P conductivity material, or replacing P conductivity material with N conductivity material.

Additionally, it would also be possible to substitute N conductivity material for the P conductivity material 29, shown in transistor 15 and thereby employ two depletion mode transistors within one V groove MOSFET or substitute for the conductivity material 23, P conductivity material in transistor 13 thereby employing two enhancement MOSFETS in the single groove. Or additionally, the P channel material 29 may be exchanged for the N type conductivity material 23 and vise versa so that transistor 13 becomes an enhancement type MOSFET and transistor 15 becomes a depletion Mosfet. Additionally, as shown in FIG. 1, additional other transistors may be formed on the same substrate 11 with the V gate MOSFET. In this case, a third transistor, 41 is shown having source 19 with conductive terminal 21, gate 43 spaced opposite and adjacent the channel area 45 and drain 47 having conductive terminal 43 all mounted on the same substrate 11 as is the split gate VMOS FET 10.

It should be recognized that a second V groove MOSFET or MESFET could be similarly mounted with a common terminal.

As shown, the source 19 of transistor 41 is in common with the drain 19 of transistor 13. However, transistor 41 may be isolated from transistor 13 and transistor 15 and may be mounted on the same substrate 11 having its own source and drain separate and isolated from the source and drains of the split gate MOSFET 10. Such an agreement is shown in FIG. 3 wherein the split gate MOSFET 10 is shown mounted on the same substrate as the transistor 41. Similar parts are indicated by the same numerals. As shown in FIG. 3, transistor 41 is mounted on substrate 11 with the MOSFETS 13 and 15 of transistor VMOS 10, and source drains 51 and 47, electrically isolated from the split gate V groove MOSFET 10. Terminal 53 is connected to conductive material 51.

Further, as is known in the art, the substrate may be of the same conductivity material as a channel element but of a lesser or greater conductivity.

Further, even though MOSFETS are shown, a MESFET split gate V groove can be produced less substantially as shown, but using the known MESFET structure for the MOSFET structure shown.

Figure 4B:
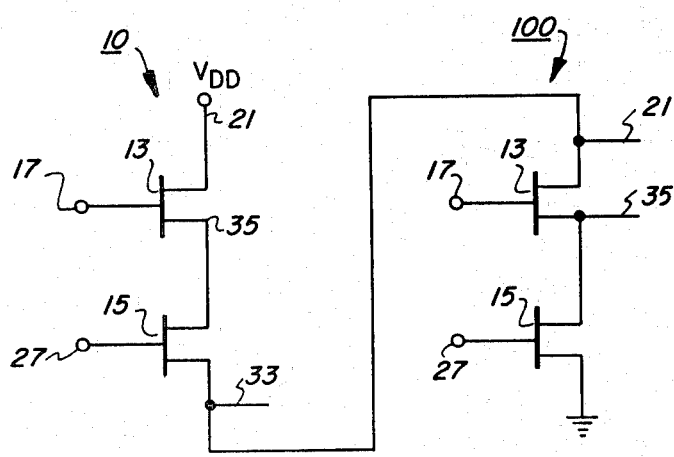

Another arrangement of the split gate V MOSFET is shown in FIGS. 4a and 4b.

FIGS. 4a and b demonstrate the electrically isolated characteristic of each V groove from any other V groove on the same substrate. FIG. 4a is similar to FIG. 1 with the same numbers indicating same parts. In this case, two identical split gate V groove MOSFETS are shown, indicated by numerals 10 and 100 corresponding to the MOSFET 10 shown in FIG. 1.

As shown in FIG. 4a, with no electrical connections between the terminals 33, 27, 17, and 21 and 35 of either of the two V groove MOSFETS shown in FIG. 4a, the two V groove MOSFETS are electrically isolated from each other. This is in distinction to the prior art where each V groove MOSFET mounted on a substrate would be connected through the substrate and share a common terminal through the substrate.

In this invention, the two terminals 35 identified with the body of conductive material 25 at the apex of the MOSFET are electrically insulated. The advantages can be seen in FIG. 4b where each of the two MOSFETS may be connected in cascade in this case as a NAND gate. This connection would not be possible without the isolated nature of the split gate V groove MOSFET from every other split gate V groove MOSFET on the same substrate.

Further, the VMOSFET's located on a common substrate may additionally show a common terminal as does VMOSFET 10 and MOSFET 41 shown in FIG. 1. In this case, referring to FIG. 4a, terminal 19 of VMOSFET 10 would be in common with terminal 31 of VMOSFET 100. Additionally, as is known in the art, additional types of transistors can be located on the same substrate and connected thereto by known electrical techniques.

What is claimed is:

1. A split gate V groove FET device mounted in a substrate with a first terminal comprising a body of a first conductive material in the apex of said V groove, said first terminal connected to a first conductive channel in a first side of said V groove to form a first transistor and said first terminal connected to a second conductive channel in a second side of said V groove to form a second transistor, said V groove is mounted in a substrate of a body of conductive material of a second type, said first and second channels being connected to respective second and third terminals of conductive material of said first type and at ends opposite from the apex of said V groove.

2. The split gate V groove FET device of claim 1 with conductive elements being connected to the said first, second and third terminals.

3. The split gate V groove FET device of claim 1 with the said second and third terminal being the source or drain terminal of said first and second transistors and wherein said substrate of said second conductivity substantially electrically isolates the said terminals of said transistors.

4. The split gate V groove FET device of claim 2 wherein said conductive material of said first type is N type conductive material and said conductive material of said second type of P type conductive material.

5. The split gate V groove FET device of claim 2 wherein said first conductive material is P type material and said second conductive material is N type conductive material.

6. The split gate V groove FET device of claim 1 wherein said substrate contains at least a second split gate V groove FET, said second split gate V groove having a first terminal comprising said first conductive material located in the apex of said V groove, said first terminal connected to a first conductive channel in the first side of said V groove to form a first transistor and said first terminal connected to a second conductive channel in the second side of said V groove to form a second transistor.

7. The split gate V groove FET device of claim 6 wherein said second V groove transistor is mounted on said substrate of conductive material of the second type, said first and second channels being connected to respective second and third terminals of conductive material of said first type at the opposite ends from the apex of said V groove.

8. The split gate V groove FET device of claim 7 wherein the second or third terminals of said second V groove are the source and drain terminals of the first and second transistors within said second V groove and wherein the substrate of said second conductivity substantially isolates the terminals of said second V groove from the terminals of said first V groove.

9. The split gate V groove FET device of claim 7 wherein a terminal of said second split V groove FET opposite from the apex terminal is in common with a terminal of said first split gate V groove FET, said common terminal of said first V groove being opposite the apex terminal of said first split gate VFET.

10. The split gate V groove FET device of claim 2 wherein said first transistor within said V groove has a gate, said gate being connected to said common terminal at the apex of said V groove and said first and second transistors within said V groove form an inverter stage.

11. The split gate V groove FET device of claim 6 wherein one of said terminals of a first transistor within said first V groove, said terminal being opposite said terminal at the apex of said V groove, is connected to one of the terminals of said second transistor which is opposite to the apex terminal of said second V groove and wherein one of the transistors of said first V groove is operated in cascade with a transistor of said second V groove.

12. The split gate V groove FET of claim 3 wherein said first transistor has a first gate of conductive materials spaced adjacent said first channel and said second transistor has a second gate of conductive materials spaced adjacent said second channel said second gate being connected to said first terminal.

13. The split gate V groove FET of claim 12 wherein a power source is connected to said second terminal and said third terminal to form an inverter stage within said split V groove FET.

14. The split gate V groove FET of claim 3 wherein said third terminal is a source for said second transistor said first terminal is the drain of said second transistor and the source of said first transistor, said first terminal is the drain of said second transistor wherein said first transistor has a gate and said second transistor has a gate, said first transistor gate being connected to said first terminal.

15. The split gate V groove FET of claim 14 wherein said third terminal of said second transistor and said third terminal of said first transistor are connected to a source to form an inverter stage.

16. The split gate V groove FET of claim 6 wherein said substrate substantially electrically isolates the terminals at said plurality of split V groove FETS.

17. The split gate V groove FET of claim 6 wherein said second terminal of said first split groove V FET is a common terminal of said second split V groove FET mounted on said substrate.

18. The split gate V groove FET of claim 16 wherein said terminals of said first split V groove FET are substantially isolated from the terminals of said second split V groove FET by said substrate and wherein a terminal of said first split V groove FET is electrically connected to a terminal of said second split V groove.

19. The split gate V groove FET of claim 3 wherein a second transistor is mounted on said substrate wherein the terminals of said split V groove FET and of said second transistor are electrically isolated by said substrate and a terminal of said split V groove FET is electrically connected to a terminal of said second transistor.

20. The split gate V groove device of claim 1 wherein said device is a MOSFET.

21. The split gate V groove device of claim 1 wherein said device is a MESFET.

* * * * *